(12) United States Patent
Mills et al.

(10) Patent No.: US 9,997,895 B2
(45) Date of Patent: Jun. 12, 2018

(54) LOAD BUSS ASSEMBLY AND METHOD OF MANUFACTURING THE SAME

(71) Applicant: Labinal, LLC, Denton, TX (US)

(72) Inventors: Patrick W. Mills, Bradenton, FL (US); Richard G. Benshoff, Sarasota, FL (US); James M. McCormick, Bradenton, FL (US)

(73) Assignee: LABINAL, LLC, Denton, TX (US)

( * ) Notice: Subject to any disclaimer, the term of this patent is extended or adjusted under 35 U.S.C. 154(b) by 106 days.

(21) Appl. No.: 14/413,605

(22) PCT Filed: Mar. 19, 2013

(86) PCT No.: PCT/US2013/032927
§ 371 (c)(1),
(2) Date: Jan. 8, 2015

(87) PCT Pub. No.: WO2014/011243
PCT Pub. Date: Jan. 16, 2014

(65) Prior Publication Data
US 2015/0194794 A1   Jul. 9, 2015

Related U.S. Application Data

(60) Provisional application No. 61/670,741, filed on Jul. 12, 2012.

(51) Int. Cl.
*H02B 1/20* (2006.01)
*H05K 1/02* (2006.01)
(Continued)

(52) U.S. Cl.
CPC ............ *H02B 1/202* (2013.01); *H02B 1/056* (2013.01); *H05K 1/0201* (2013.01);
(Continued)

(58) Field of Classification Search
CPC ... H05K 1/0201–1/0212; H05K 1/0272; Y10T 29/49162
See application file for complete search history.

(56) References Cited

U.S. PATENT DOCUMENTS 4,655,535 A   4/1987   Kysiak
4,750,889 A   6/1988   Ignasiak
(Continued)

FOREIGN PATENT DOCUMENTS

DE   7923147   12/1979
DE   8034702   4/1981
(Continued)

OTHER PUBLICATIONS

CoolPoly® Thermally Conductive Plastics for Substrates and Electronic Packaging, Cool Polymers Inc., 2005, 1 page.*
(Continued)

*Primary Examiner* — Robert J Hoffberg
(74) *Attorney, Agent, or Firm* — Rankin, Hill & Clark LLP (57) ABSTRACT

A method of manufacturing a load buss array assembly includes placing a plurality of load conductors within a thermally conductive substrate, placing a portion of a load connector within the thermally conductive substrate, and electrically connecting the load conductors to the portion of the load connector within the thermally conductive substrate.

20 Claims, 11 Drawing Sheets

(51) Int. Cl.
*H05K 3/34* (2006.01)
*H02B 1/056* (2006.01)

(52) U.S. Cl.
CPC ............ *H05K 1/0296* (2013.01); *H05K 3/34* (2013.01); *Y10T 29/4913* (2015.01); *Y10T 29/49144* (2015.01); *Y10T 29/49146* (2015.01); *Y10T 29/49162* (2015.01)

(56) References Cited

U.S. PATENT DOCUMENTS

| | | | | |
|---|---|---|---|---|
| 4,908,259 | A * | 3/1990 | Yumoto | B29C 70/72 174/250 |
| 5,015,519 | A * | 5/1991 | Yumoto | B29C 70/72 174/250 |
| 5,041,699 | A | 8/1991 | Soliday | |
| 5,310,353 | A | 5/1994 | Parrish | |
| 5,453,016 | A * | 9/1995 | Clark | H01R 12/724 439/79 |
| 5,537,294 | A * | 7/1996 | Siwinski | H05K 9/0039 235/380 |
| 6,180,045 | B1 * | 1/2001 | Brandenburg | H05K 3/0061 264/263 |
| 6,220,877 | B1 | 4/2001 | Alexander | |
| 6,285,551 | B1 * | 9/2001 | Brandenburg | H05K 3/0061 165/185 |
| 6,359,770 | B1 * | 3/2002 | Kolody | H04Q 1/03 361/626 |
| 6,490,169 | B1 * | 12/2002 | Watanabe | H01R 12/79 174/250 |
| 6,528,145 | B1 * | 3/2003 | Berger | H01L 21/4857 174/256 |
| 6,769,932 | B1 * | 8/2004 | Daoud | H01R 12/7011 439/458 |
| 6,881,291 | B2 * | 4/2005 | Platz | B29C 66/7392 156/272.8 |
| 7,135,119 | B2 * | 11/2006 | De Oliveira | H05K 3/002 216/18 |
| 7,563,112 | B2 * | 7/2009 | Honda | H01R 43/0256 439/79 |
| 7,592,536 | B2 * | 9/2009 | Glenn | H01L 31/052 136/244 |
| 8,094,436 | B2 | 1/2012 | Mills et al. | |
| 8,118,605 | B2 * | 2/2012 | Yoshida | B60Q 3/0203 439/76.2 |
| 8,328,575 | B2 * | 12/2012 | Meux | H02B 1/056 361/634 |
| 8,383,940 | B2 * | 2/2013 | Yoshida | B60Q 3/0203 174/68.2 |
| 8,450,614 | B2 * | 5/2013 | Kato | H05K 1/0219 174/254 |
| 8,933,340 | B2 * | 1/2015 | Kato | H05K 1/0219 174/254 |
| 9,408,292 | B2 * | 8/2016 | Mills | H05K 3/202 |
| 9,460,879 | B2 * | 10/2016 | Mills | H01H 71/12 |
| 2010/0012354 | A1 * | 1/2010 | Hedin | H05K 1/0313 174/252 |
| 2010/0186997 | A1 * | 7/2010 | Vicich | H05K 3/3478 174/254 |
| 2010/0296229 | A1 * | 11/2010 | Meux | H02B 1/056 361/605 |
| 2011/0122549 | A1 | 5/2011 | Coffey | |
| 2011/0186327 | A1 * | 8/2011 | Yoshida | B60Q 3/0203 174/68.2 |
| 2011/0189871 | A1 * | 8/2011 | Yoshida | F21V 21/34 439/110 |
| 2011/0235244 | A1 | 9/2011 | Mills et al. | |
| 2012/0300421 | A1 * | 11/2012 | Askarinya | A61M 5/14276 361/757 |
| 2015/0153414 | A1 * | 6/2015 | Mills | H01H 71/04 324/424 |
| 2015/0271942 | A1 * | 9/2015 | Mills | H05K 7/02 361/728 |

FOREIGN PATENT DOCUMENTS

| | | | |
|---|---|---|---|
| JP | H07-335295 | 12/1995 | |
| JP | H08-195250 | 7/1996 | |
| JP | 2000-323871 | 11/2000 | |
| JP | WO 2010131523 A1 * | 11/2010 | ........... H05K 1/0219 |
| RU | 2088057 C1 | 8/1997 | |
| RU | 2279770 C2 | 7/2006 | |

OTHER PUBLICATIONS

International Search Report filed in PCT/US2013/032927 dated Jun. 28, 20113.
Russian Office Action with English Translation dated Mar. 28, 2017, 12 pages.
Japanese Office Action with English Translation dated Jan. 24, 2017, 10 pages.
Russian Decision on Grant with English Translation dated Aug. 24, 2017, 16 pages.

* cited by examiner

LOAD BUSS ASSEMBLY AND METHOD OF MANUFACTURING THE SAME

CROSS REFERENCE TO RELATED APPLICATION

This application claims the benefit of U.S. Provisional Patent Application Ser. No. 61/670,741, filed Jul. 12, 2012, which is incorporated by reference herein.

BACKGROUND

Field

The disclosed concept pertains generally to load modules and, more particularly, to load buss assemblies for such load modules. The disclosed concept further pertains to methods of manufacturing load buss assemblies.

Background Information

U.S. Pat. No. 8,094,436 discloses a plug-in circuit breaker panel including a housing, an electrical bus structure coupled to the housing, and a number of first plug-in members coupled to the electrical bus structure. A number of circuit breakers include a first surface and a second plug-in member disposed opposite the first surface. The second plug-in member of each of the number of circuit breakers is mated with a corresponding one of the number of first plug-in members. A plate member is removably coupled to the housing. The plate member includes a first surface and an opposite second surface. The first surface of the number of circuit breakers engages the opposite second surface of the plate member in order to maintain mating of each of the number of circuit breakers with the corresponding one of the number of first plug-in members.

The rear of the plug-in circuit breaker panel includes first and second feeders for a three-phase alternating current (AC) system. Typically, for each of the feeders, there can be a single three-pole AC circuit breaker and a plurality of single pole AC circuit breakers for each of the three phases. For example, each of the feeders is a three-terminal terminal block having three power terminals for the three phases of the corresponding feeder. A first surface of the electrical bus structure is proximate the number of first plug-in members, and the feeders and power terminals thereof are coupled to the opposite second surface along with a number of load connectors. The load connectors include load outputs (e.g., loads) from the corresponding circuit breakers associated with the respective feeders. In a similar manner, the power inputs (e.g., lines) to the corresponding circuit breakers are associated with the respective feeders. The electrical bus structure (e.g., a number of inner power layers thereof) suitably routes the load outputs from and the power inputs to the various circuit breakers.

While the feeders are directly coupled to the electrical bus structure at corresponding terminal blocks and power terminals thereof, the load outputs from the circuit breakers are electrically connected between the electrical bus structure and corresponding load connectors by a number of discrete conductors or ribbon cable. As a result, a manual operation is needed to electrically connect the load outputs between the electrical bus structure and the corresponding load connectors. Also, the load connectors and the discrete conductors or ribbon cable significantly increase the size of the plug-in circuit breaker panel.

Therefore, there is room for improvement in circuit breaker panels.

There is also room for improvement in load buss assemblies of circuit breaker panels.

There is further room for improvement in methods of manufacturing load buss assemblies of circuit breaker panels.

SUMMARY

These needs and others are met by aspects of the disclosed concept which place a plurality of load conductors within a thermally conductive substrate; place a portion of a load connector within the thermally conductive substrate; and electrically connect the load conductors to the portion of the load connector within the thermally conductive substrate.

In accordance with one aspect of the disclosed concept, a load buss array assembly comprises: a thermally conductive substrate; a plurality of load conductors placed within the thermally conductive substrate; and a portion of a load connector placed within the thermally conductive substrate, wherein the load conductors are electrically connected the portion of the load connector within the thermally conductive substrate.

In accordance with another aspect of the disclosed concept, a method of manufacturing a load buss array assembly comprises: placing a plurality of load conductors within a thermally conductive substrate; placing a portion of a load connector within the thermally conductive substrate; and electrically connecting the load conductors to the portion of the load connector within the thermally conductive substrate.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept employs miniature conductive traces embedded in a thermally conductive substrate as part of a method of construction and automated electrical connection of a load connector to a plurality of load buss array miniature conductive traces. This method simplifies the construction of a load module, and provides considerable size, depth and weight benefits as compared to known methods of packaging a wiring interconnect.

The disclosed concept preferably provides: (1) a 100% thermally conductive backplane; and (2) a 100% embedded load conductor solution.

The materials of the miniature conductive traces can be, for example, copper or aluminum.

The materials of the thermally conductive substrate can be relatively highly heat-resistant resins like a liquid-crystal polymer (LCP) or polyetheretherketone (PEEK).

The disclosed concept is described in association with subminiature or aircraft circuit breakers, although the disclosed concept is applicable to a wide range of different circuit breakers for a wide range of different applications. Such circuit breakers can be employed, for example and without limitation, in aircraft alternating current (AC) systems having a typical frequency of about 400 Hz, but can also be used in direct current (DC) systems. It will also become evident that the disclosed concept is applicable to other types of circuit breaker panels including those used in AC systems operating at other frequencies; to larger circuit breakers, such as miniature residential or commercial circuit breakers; and to a wide range of circuit breaker applications, such as, for example, residential, commercial, industrial, aerospace, and automotive. As further non-limiting examples, both AC (e.g., without limitation, 120, 220, 480-600 VAC) operation at a wide range of frequencies (e.g., without limitation, 50, 60, 120, 400 Hz, and higher or lower frequencies) and DC operation (e.g., without limitation, 42 VDC) are possible. As still further non-limiting examples, single phase and plural phase (e.g., without limitation, three phase) operation are possible.

Figure 1A:
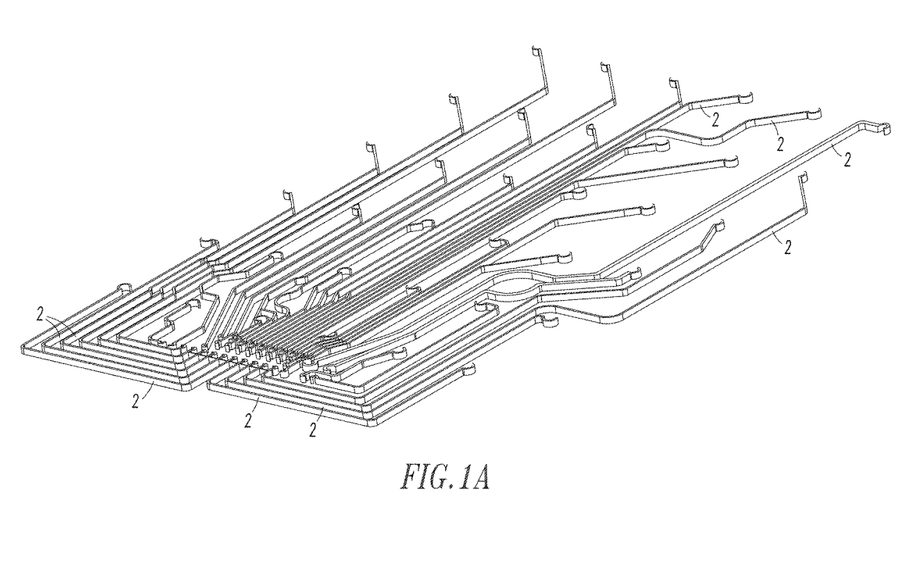
FIG. 1A is an isometric view of a plurality of miniature conductive traces for a load buss array assembly in accordance with embodiments of the disclosed concept.
Figure 1B:
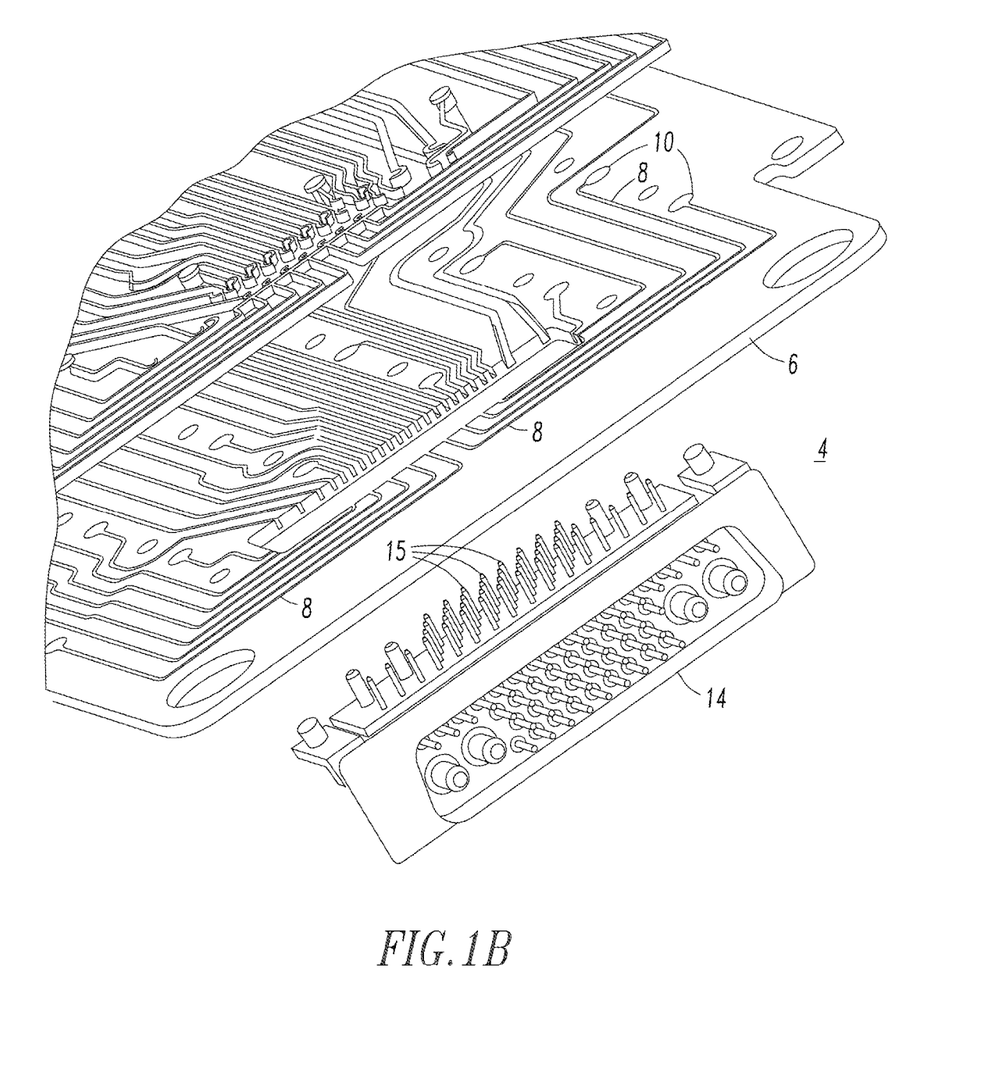
FIG. 1B is an exploded isometric view of the miniature conductive traces of FIG. 1A, a thermally conductive substrate and a load connector for a load buss array assembly in accordance with another embodiment of the disclosed concept.
Figure 1C:
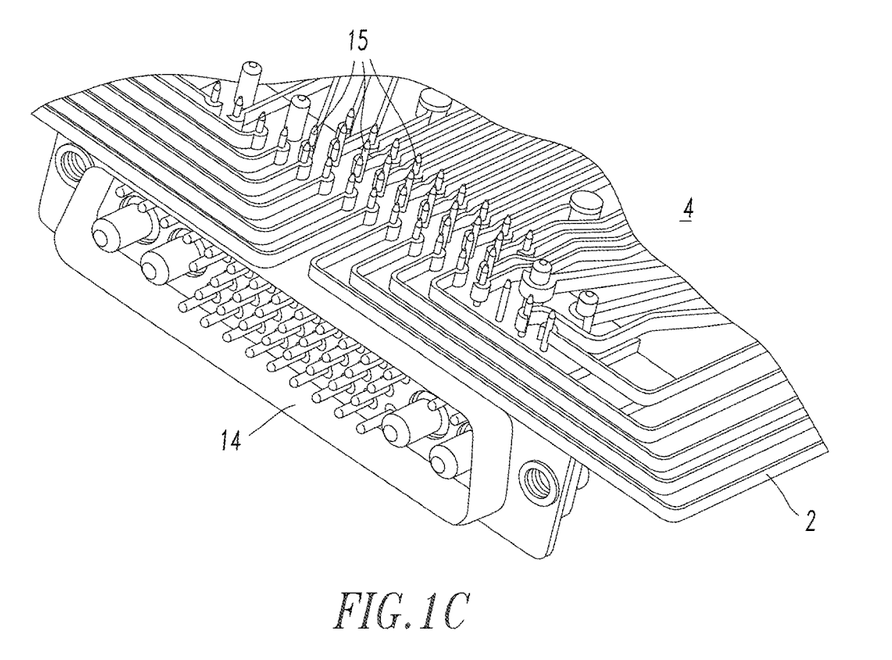
FIG. 1C is an isometric view of the miniature conductive traces and the load connector of FIG. 1B.
Figure 2A:
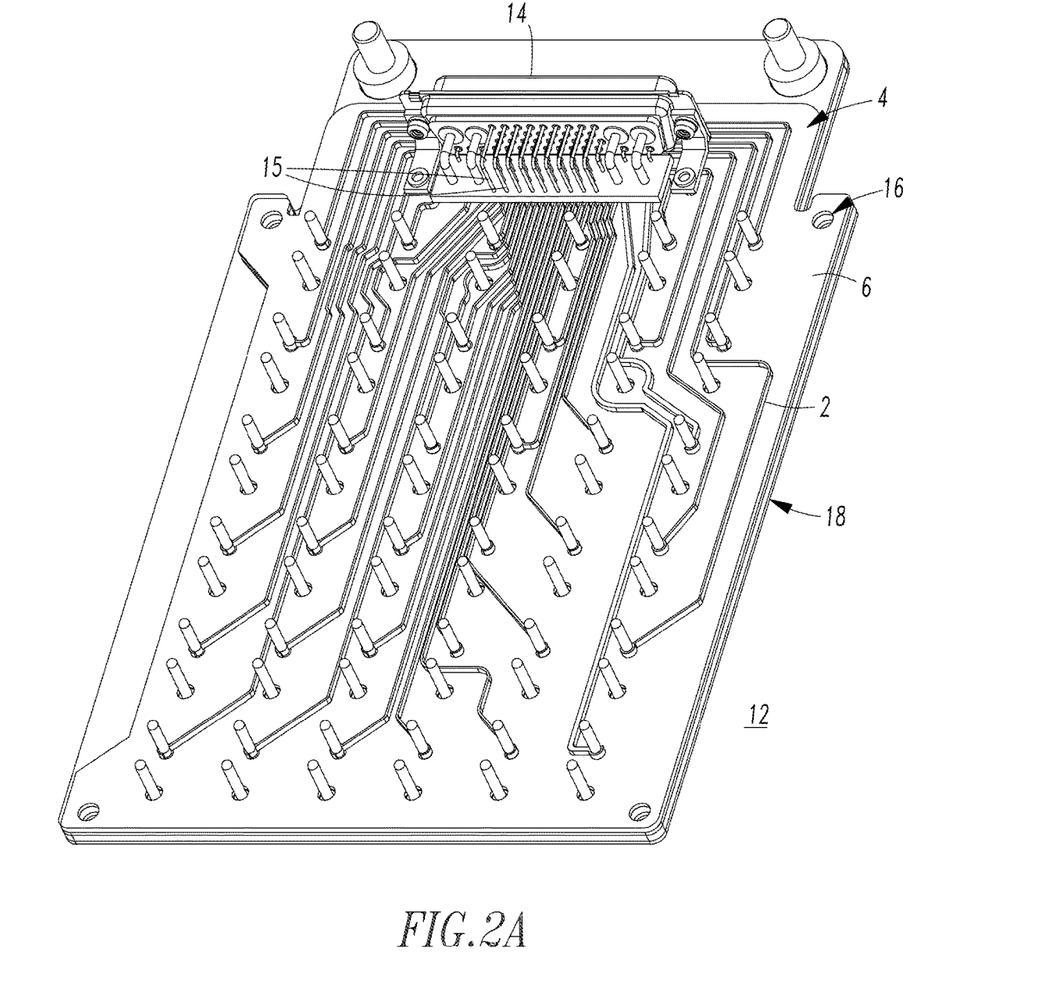
FIGS. 2A and 2B are an isometric view and a side vertical elevation view, respectively, showing the load conductive traces of a load buss array assembly of a load module assembly in accordance with another embodiment of the disclosed concept.
Figure 2B:
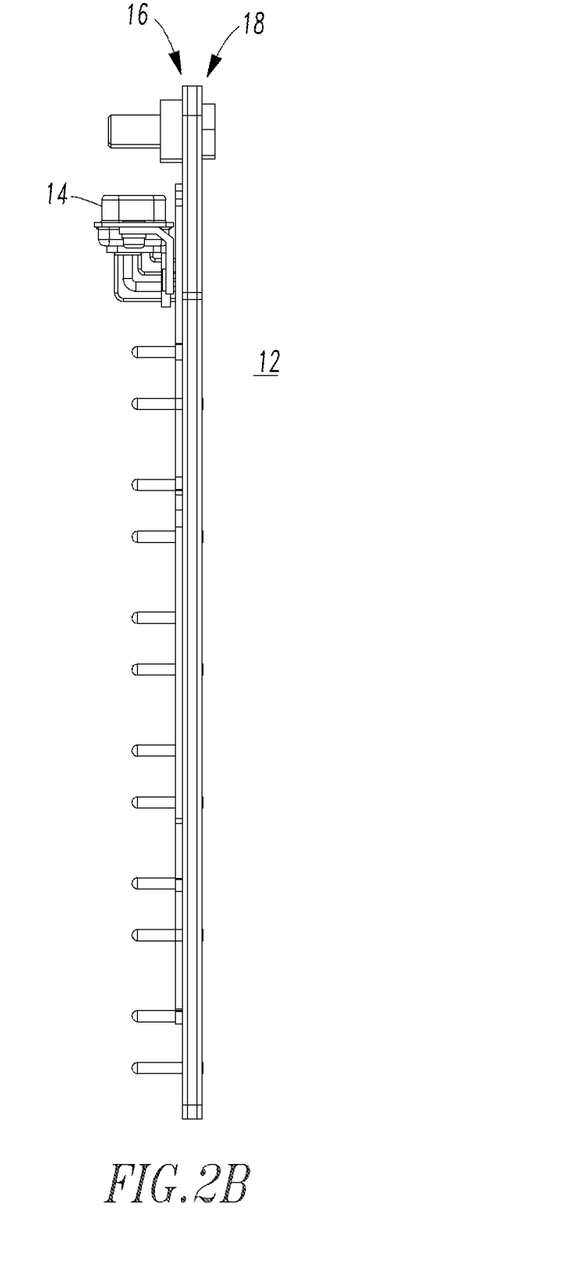

The miniature conductive traces 2 of a load buss array assembly 4 (FIGS. 1B and 1C) are suitably embedded in a thermally conductive substrate 6 (FIG. 1B). For example and without limitation, the thermally conductive substrate 6 is suitably molded or machined to have grooves 8 and holes 10 to accept the miniature conductive traces 2 as shown in FIG. 1B. The corresponding load module 12 (FIGS. 2A and 2B) replaces a known prior load module (not shown) having discrete wiring over-molded into urethane and attached to an embedded feed section via sockets. See, for example, U.S. Pat. No. 8,094,436, which is incorporated by reference herein.

The disclosed method simplifies the construction of the load buss array assembly 4 and, thus, the load module 12. This permits, for example, the miniature conductive traces 2, which function as load conductors, to be embedded in the molded thermally conductive substrate 6 (e.g., without limitation, a liquid-crystal polymer (LCP), such as CoolPoly® E-series thermally conductive plastic marketed by Cool Polymers, Inc. of North Kingstown, R.I.; a suitable thermally conductive and electrically insulative epoxy), which seals and insulates the load conductors.

Alternatively, if the thermally conductive substrate 6 is machined, then the load conductors can be sealed and insulated (e.g., a conductor is placed in a channel and is sealed and insulated from other conductors and from the outside environment) by employing a suitable sealant (not shown) such as, for example and without limitation, tape, glue or epoxy. For example, the material is electrically insulative with adhesive on both sides, and is relatively very thin (e.g., without limitation, 0.005 in.) and conforms to the substrate 6 and traces 2.

Figure 3A:
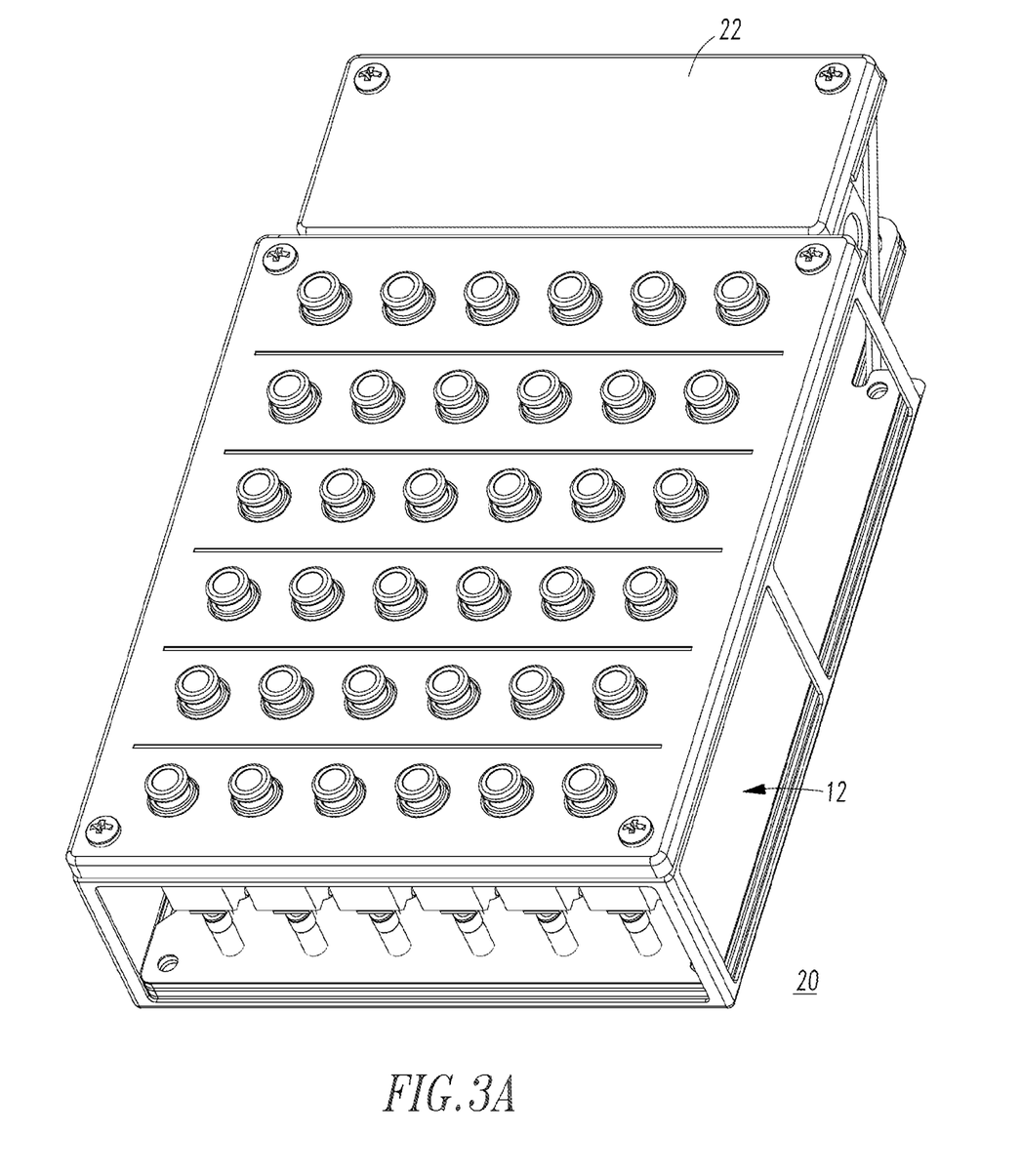
FIGS. 3A and 3B are an isometric view and a side vertical elevation view, respectively, of a circuit breaker panel including the load module assembly with embedded feeder layers and the load buss array assembly of FIG. 2A.
Figure 3B:
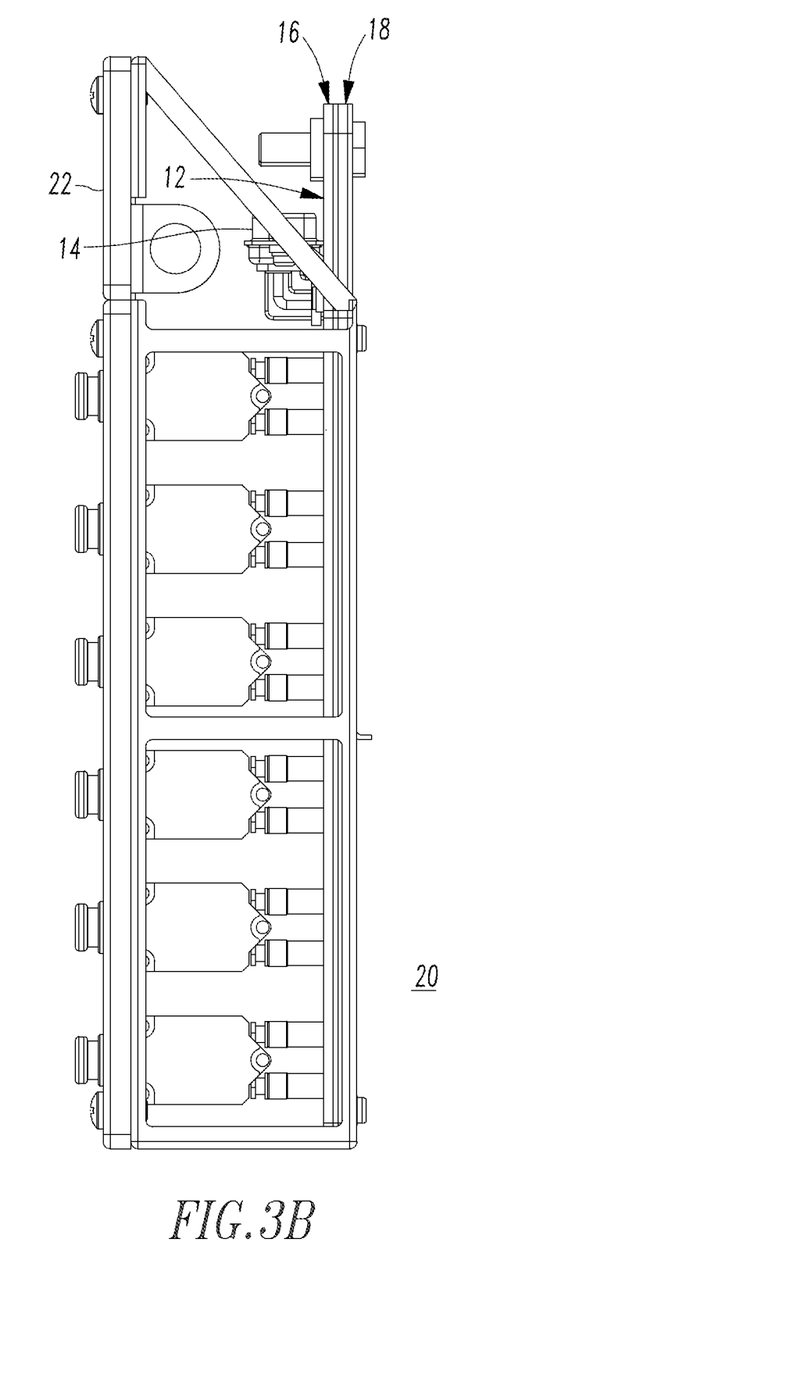

The miniature conductive traces 2 can be automatically coupled to a load connector 14 and its load pins 15 (FIGS. 1B and 1C) by fixturing and by employing a conventional wave soldering process. For example, the load conductors are placed in the thermally conductive substrate 6 during molding, and the load connector 14 is fixtured to have a precise location and fit. Then, the load buss array assembly 4 is fed through a suitable wave soldering station (not shown) to electrically couple the connector load pins 15 and the load connector 14 to the load conductor traces 2. Alternatively, this could be a manual operation, but would not be cost favorable. This eliminates point-to-point wiring attachments (e.g., without limitation, crimps; hand soldering). The disclosed concept adds about another 0.25" of depth for the load thermally conductive substrate layers 16, which are directly coupled to feeder layers 18 of the load module 12 (FIGS. 2A, 2B, 3A and 3B). Also, a significant overall depth reduction to about 1" to about 2" from about 4" to about 5" of baseline depth is provided for the corresponding circuit breaker panel 20 (FIGS. 3A, 3B and 4).

Figure 4:
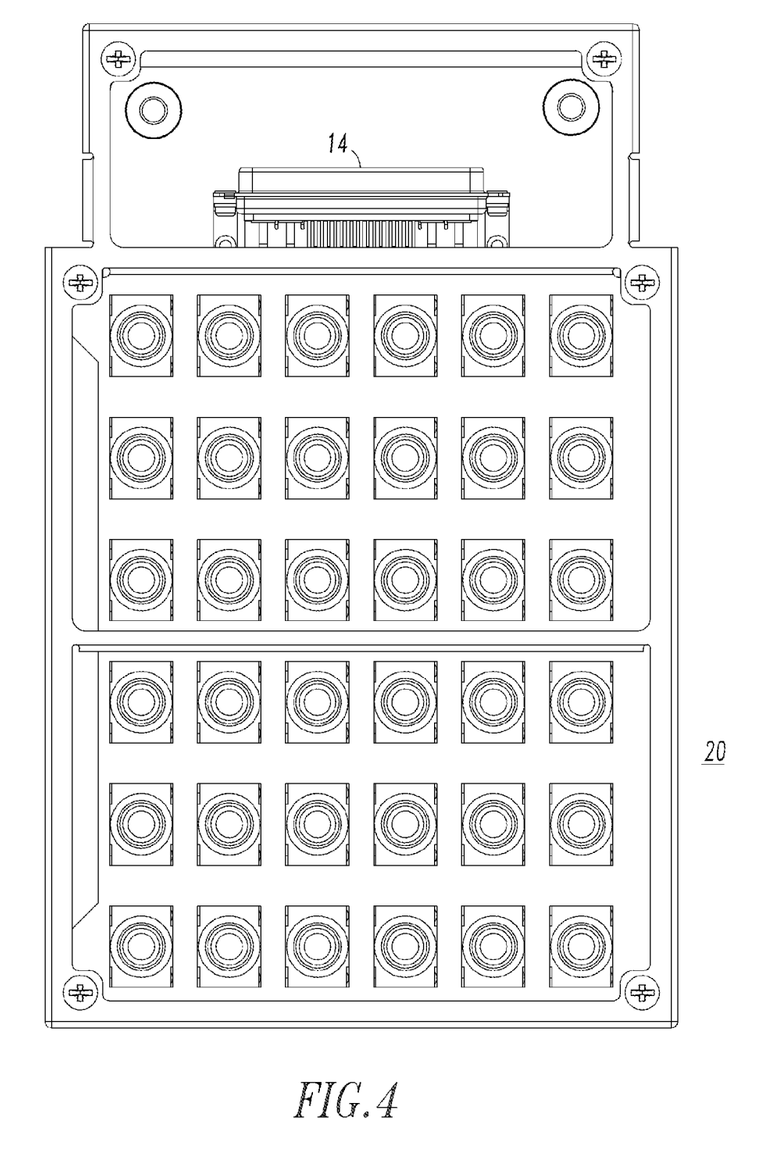
FIG. 4 is a plan view of the circuit breaker panel of FIG. 3A with a cover removed to show a load connector.

FIG. 4 shows the circuit breaker panel 20 with its cover 22 (shown in FIGS. 3A and 3B) removed to show the load connector 14.

Figure 5A:
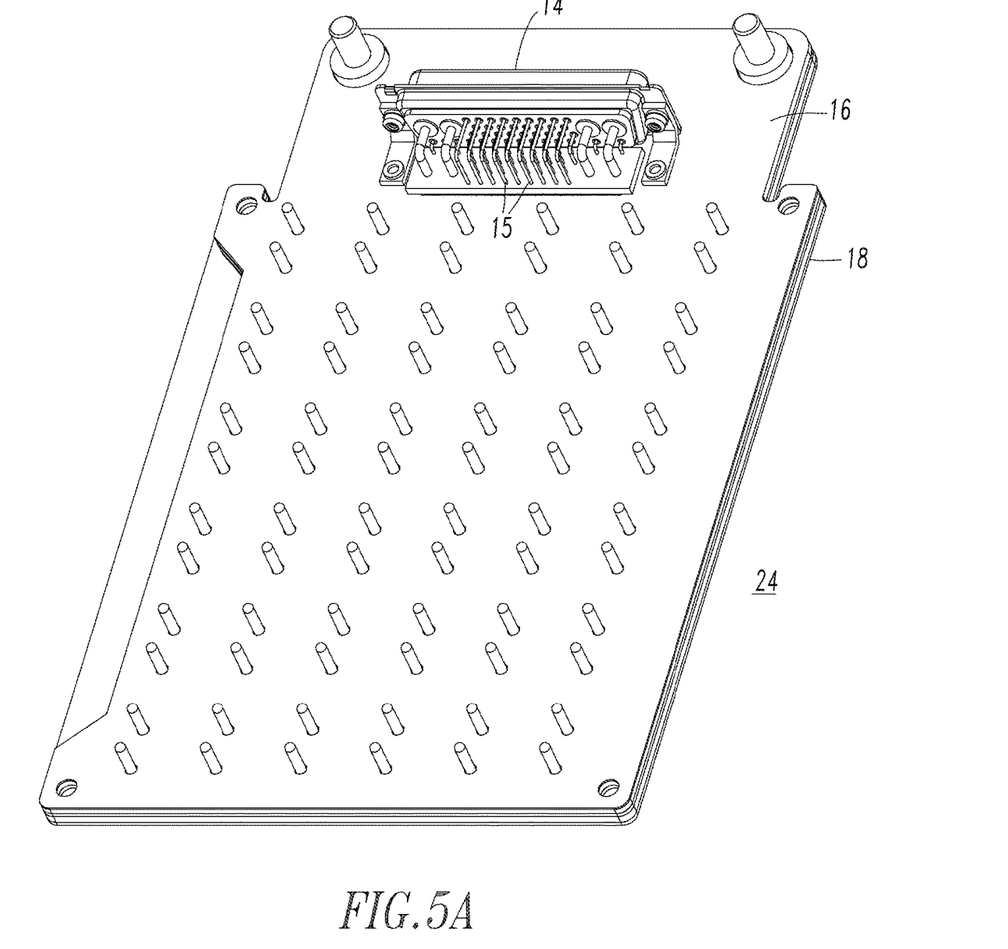
FIGS. 5A and 5B are an isometric view and a side vertical elevation view, respectively, of a backplane module including the embedded feeder layers and the load buss array assembly of FIG. 2A.
Figure 5B:
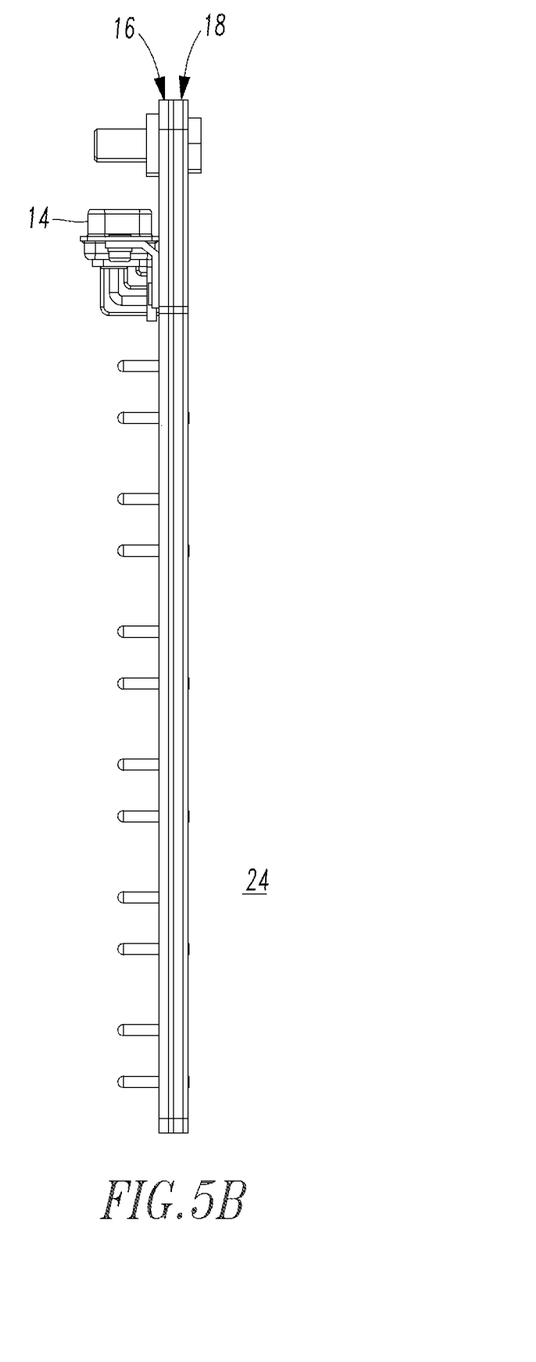
Figure 6:
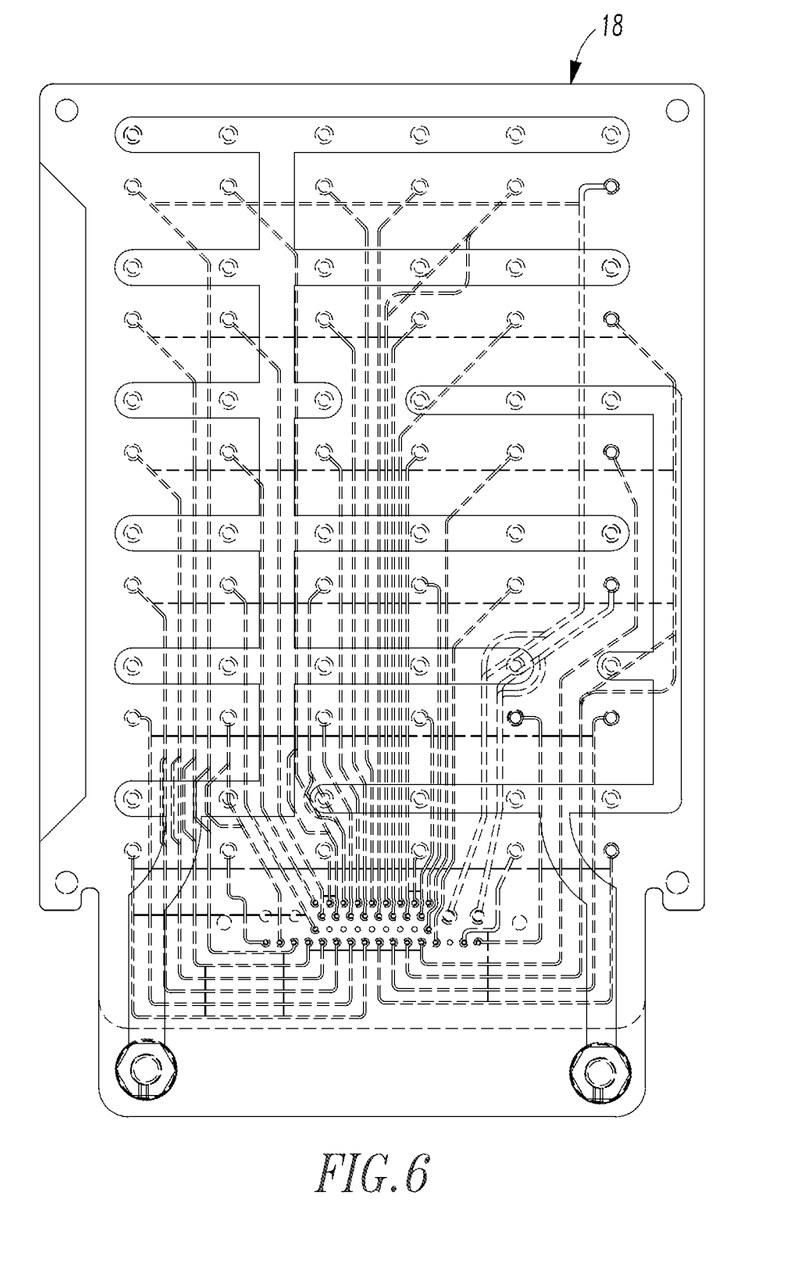
FIG. 6 is a plan view of the embedded feeder layers of the backplane module of FIG. 5A with the load buss array assembly removed.

FIGS. 5A and 5B show the backplane module 24 of the circuit breaker panel 20.

Various possible methods to place the load conductors within the thermally conductive substrate 6 include: (1) over-molding the miniature conductive traces 2 into the thermally conductive substrate 6; (2) hand placement of the miniature conductive traces 2 into the thermally conductive substrate 6; and (3) automated bobbin winding placement if the miniature conductive traces 6 have a suitable cross-section (e.g., without limitation, flat; round; square). For example, for the latter method, an uncoated load conductor (not shown) is placed with a CNC (x,y,z) controlled winder (not shown), such that a placed wire conductor (e.g., 2 of FIG. 2A) is cut and placed without the use of manual touch-labor. The automated winding placement is suited to high-volume production, much like a wire feeder. This precisely feeds a wire cut length (not shown) to a nozzle (not shown), which is CNC-controlled to place the conductor (e.g., 2 of FIG. 1A) into a groove 8 (FIG. 1B) in the thermally conductive substrate 6 (FIG. 1B).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A load buss array assembly comprising:
   a thermally conductive substrate;
   a plurality of load conductors placed within the thermally conductive substrate; and a portion of a load connector placed within the thermally conductive substrate, wherein the load connector includes a load output from a circuit breaker, wherein the load conductors are electrically connected to the portion of said load connector within the thermally conductive substrate, wherein each of the load conductors has a substantially constant cross-section throughout each of the load conductors, and wherein the load conductors are entirely embedded within the thermally conductive substrate.

2. The load buss array assembly of claim 1 wherein said load conductors are a plurality of conductive traces.

3. The load buss array assembly of claim 2 wherein said conductive traces have a round cross-section.

4. The load buss array assembly of claim 2 wherein said conductive traces have a square cross-section.

5. The load buss array assembly of claim 1 wherein said plurality of load conductors are over-molded into the thermally conductive substrate so as to be completely surrounded.

6. The load buss array assembly of claim 1, further comprising:
a wave solder connection within the thermally conductive substrate, wherein the wave solder connection electrically joins the load conductors to the portion of said load connector.

7. The load buss array assembly of claim 1, wherein the load connector includes a plurality of load pins that each have an outer diameter and the load conductors each include a loop disposed entirely within the thermally conductive substrate that circumferentially extend around only a portion of the outer diameter of a respective one of the plurality of load pins to electrically connect the load connector to the load conductors.

8. A load module comprising the load buss array assembly of claim 1.

9. A circuit breaker panel comprising:
a cover; and
a backplane module that includes a thermally conductive substrate, a plurality of load conductors placed within the thermally conductive substrate, and a portion of a load connector placed within the thermally conductive substrate, wherein the load connector includes a load output from a circuit breaker, wherein the load conductors are electrically connected to the portion of said load connector within the thermally conductive substrate, wherein each of the load conductors has a substantially constant cross-section throughout each of the load conductors, and wherein the plurality of load conductors are entirely embedded within the thermally conductive substrate.

10. The circuit breaker panel of claim 9, further comprising:
a wave solder connection within the thermally conductive substrate, wherein the wave solder connection electrically joins the load conductors to the portion of said load connector.

11. The circuit breaker panel of claim 9, wherein said plurality of load conductors are over-molded into the thermally conductive substrate so as to be completely surrounded.

12. The circuit breaker panel of claim 9, wherein the load connector includes a plurality of load pins that each have an outer diameter and the load conductors each include a loop disposed entirely within the thermally conductive substrate that circumferentially extend around only a portion of the outer diameter of a respective one of the plurality of load pins to electrically connect the load connector to the load conductors.

13. A method of manufacturing a load buss array assembly comprising:
placing a plurality of load conductors within a thermally conductive substrate such that the plurality of load conductors are entirely embedded within the thermally conductive substrate;
placing a portion of a load connector within the thermally conductive substrate, wherein the load connector includes a load output from a circuit breaker; and
electrically connecting the load conductors to the portion of the load connector within the thermally conductive substrate such that each of the load conductors has a substantially constant cross-section throughout each of the load conductors.

14. The method of claim 13 further comprising:
employing a plurality of conductive traces as said plurality of load conductors.

15. The method of claim 14 further comprising:
manually placing the conductive traces into the thermally conductive substrate.

16. The method of claim 14 further comprising:
automatically placing the conductive traces into the thermally conductive substrate.

17. The method of claim 16 further comprising:
employing the conductive traces having at least one of a round or a square cross-section; and
employing automated bobbin winding placement as said automatically placing.

18. The method of claim 14 further comprising:
automatically coupling the conductive traces to the portion of the load connector by fixturing and by wave soldering to create a wave solder connection within the thermally conductive substrate that electrically joins the load conductors to the portion of said load connector.

19. The method of claim 13 further comprising:
over-molding the plurality of load conductors into the thermally conductive substrate so that the plurality of load conductors are completely surrounded.

20. The method of claim 13, wherein each of the load conductors is electrically connected to the load connector by circumferentially extending a loop of the each of the load conductors around an outer diameter of a respectively one of a plurality of load pins of the load connector, the loop disposed entirely within the thermally conductive substrate.

* * * * *